(12) United States Patent
Zhu et al.

(10) Patent No.: US 12,740,050 B2
(45) Date of Patent: Sep. 15, 2026

(54) SEMICONDUCTOR MEMORY DEVICE AND METHOD FOR FABRICATING SAME

(71) Applicant: Hangzhou HFC Semiconductor Co., Hangzhou (CN)

(72) Inventors: Qiangtao Zhu, Hangzhou (CN); Pengpeng Wang, Hangzhou (CN); Fanyou Kong, Hangzhou (CN); Tao Wang, Hangzhou (CN); John H Zhang, Altamont, NY (US)

(73) Assignee: Hangzhou HFC Semiconductor Co., Hangzhou (CN)

( * ) Notice: Subject to any disclaimer, the term of this patent is extended or adjusted under 35 U.S.C. 154(b) by 322 days.

(21) Appl. No.: 18/665,064

(22) Filed: May 15, 2024

(65) Prior Publication Data

US 2025/0331163 A1 Oct. 23, 2025

(30) Foreign Application Priority Data

Apr. 22, 2024 (CN) ......................... 202410486890.5

(51) Int. Cl.
*H10B 12/00* (2023.01)

(52) U.S. Cl.
CPC ....... *H10B 12/373* (2023.02); *H10B 12/0385* (2023.02)

(58) Field of Classification Search
CPC .... H10B 12/00; H10B 12/02; H10B 12/0385; H10B 12/30; H10B 12/373; H10B 12/488
See application file for complete search history.

(56) References Cited

U.S. PATENT DOCUMENTS

| | | | | |
|---|---|---|---|---|
| 11,049,852 | B2 | 6/2021 | Salman et al. | |
| 11,244,947 | B1 * | 2/2022 | Zhang | H10B 12/038 |
| 2010/0213523 | A1 * | 8/2010 | Cheng | H10B 12/0387 438/246 |

* cited by examiner

*Primary Examiner* — Khiem D Nguyen
(74) *Attorney, Agent, or Firm* — MUNCY, GEISSLER, OLDS & LOWE, P.C.

(57) ABSTRACT

A semiconductor memory device and a method for fabricating the device are disclosed. In the semiconductor memory device, a doped epitaxial silicon layer epitaxially grown on a surface of a silicon layer within a trench electrically connects a transistor to a trench capacitor.

10 Claims, 7 Drawing Sheets

170
190
121
110
103
100
102
101
180
160
151
152
150
140

SEMICONDUCTOR MEMORY DEVICE AND METHOD FOR FABRICATING SAME

CROSS-REFERENCE TO RELATED APPLICATION

This application claims the priority of Chinese patent application number 202410486890.5, filed on Apr. 22, 2024 and entitled “SEMICONDUCTOR MEMORY DEVICE AND METHOD FOR FABRICATING SAME”, the entire contents of which are incorporated herein by reference.

TECHNICAL FIELD

The present invention relates to the field of semiconductor technology and, in particular, to a semiconductor memory device and a method for fabricating the device.

BACKGROUND

Dynamic random access memory (DRAM) devices are important semiconductor memory devices that are often used in power processors and application-specific integrated circuits (ASIC’s), among others. A DRAM device usually includes trench capacitors and transistors electrically connected to the trench capacitors. In conventional DRAM devices, embedded contacts are fabricated from a doped polysilicon layer. Consequently, trench capacitors in the resulting DRAM devices tend to require relatively long charge and discharge time. On the other hand, in order to obtain a desired retention time, a large capacitor has to be used, which, however, would take up too much valuable chip area. Therefore, how to achieve a good tradeoff between charge and discharge time and chip area remains a challenge for those skilled in the art.

SUMMARY OF THE INVENTION

It is an object of the present invention to provide a semiconductor memory device and a method for fabricating the device, which overcome the problem that conventional semiconductor memory devices fail to provide a good tradeoff between charge and discharge time and chip area.

To this end, the present invention provides a method for fabricating a semiconductor memory device, which comprises:

- providing a semiconductor substrate that comprises a stack of a doped silicon substrate, a buried oxide layer and a silicon layer, forming at least one trench in the semiconductor substrate, wherein the at least one trench is lined with an isolation layer, wherein the isolation layer extends from a surface of the doped silicon substrate to a surface of the buried oxide layer, wherein the trench is filled with a polysilicon layer, and wherein a top surface of the polysilicon layer is lower than a top surface of the isolation layer;
- forming a doped epitaxial silicon layer on a surface of the silicon layer within the at least one trench and forming an epitaxial polysilicon layer on the polysilicon layer within the at least one trench by performing an epitaxy process, wherein the epitaxial polysilicon layer is joined to the doped epitaxial silicon layer;
- forming at least one isolation trench by etching the silicon layer and the doped epitaxial silicon layer;
- forming an isolation dielectric layer, wherein the isolation dielectric layer fills the at least one isolation trench and extends over the doped epitaxial silicon layer; and
- forming at least one gate structure on the silicon layer and forming a passing word line (PWL) on the isolation dielectric layer.

The present invention also provides a semiconductor memory device, which comprises:

- a semiconductor substrate comprising a stack of a doped silicon substrate, a buried oxide layer and a silicon layer, wherein at least one trench is formed in the semiconductor substrate, wherein the at least one trench is lined with an isolation layer, wherein the isolation layer extends from a surface of the doped silicon substrate to a surface of the buried oxide layer, and wherein the at least one trench is filled with a polysilicon layer that has a top surface lower than a top surface of the isolation layer;
- an epitaxial polysilicon layer formed on the polysilicon layer within the at least one trench;
- a doped epitaxial silicon layer formed on a surface of the silicon layer within the at least one trench, wherein the doped epitaxial silicon layer is joined to the epitaxial polysilicon layer;
- at least one isolation trench extending from inside the doped epitaxial silicon layer to the surface of the buried oxide layer;
- an isolation dielectric layer, which fills the at least one isolation trench and extends over the doped epitaxial silicon layer; and
- at least one gate structure formed on the silicon layer and a passing word line (PWL) formed on the isolation dielectric layer.

In the semiconductor memory device and method of the present invention, the doped epitaxial silicon layer epitaxially grown on the surface of the silicon layer within the trench electrically connects a transistor to a trench capacitor. Compared with an embedded contact formed by doping a polysilicon layer, the epitaxially grown doped epitaxial silicon layer has better conductive properties and therefore allows a smaller capacitor, which takes up a reduced chip area, to be used at given required charge and discharge time. Thus, the semiconductor memory device and method of the present invention provide a good tradeoff between charge and discharge time and chip area.

In these figures, 100, a semiconductor substrate; 101, a doped silicon substrate; 102, a buried oxide layer; 103, a silicon layer; 110, a pad oxide layer; 120, a nitride layer; 121, a nitride layer; 130, a hard mask layer; 140, a trench; 150, an isolation layer; 151, a dielectric layer; 152, a barrier layer; 160, a polysilicon layer; 170, a doped epitaxial silicon layer; 170', a doped epitaxial silicon layer; 180, an epitaxial polysilicon layer; 180', an epitaxial polysilicon layer; 190, an isolation trench; 200, an isolation dielectric layer; 201, a first isolation dielectric layer; 202, a second isolation dielectric layer; 210, a gate structure; 220, a passing word line (PWL);

W1, across-sectional width; D1, a distance; D2, a distance; F1, a first direction; and F2, a second direction.

DETAILED DESCRIPTION

Figure 13:
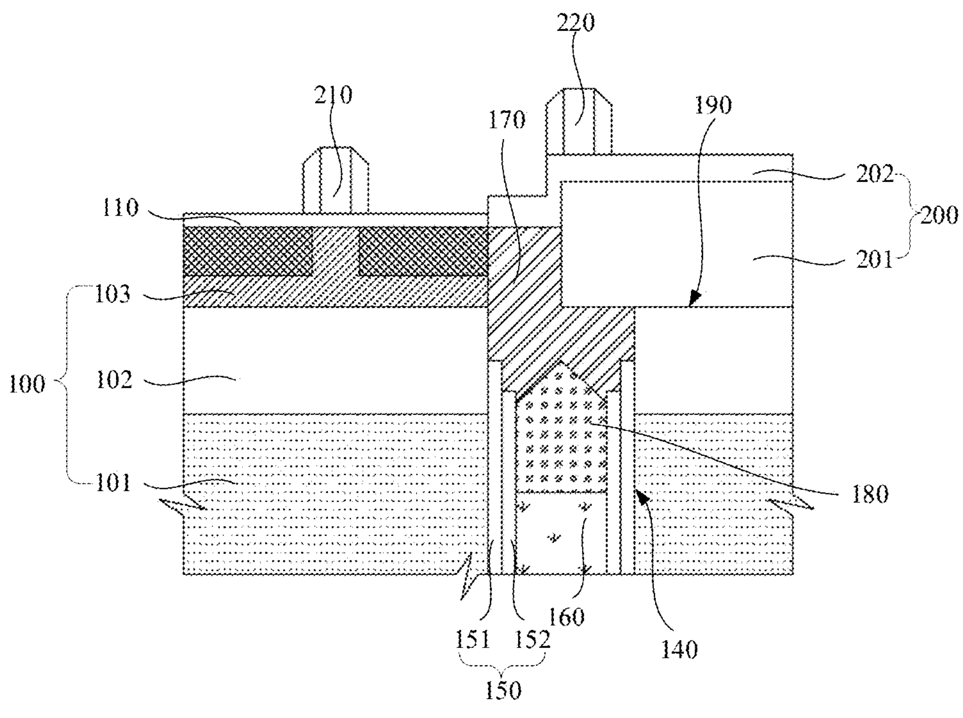
Figure 14:
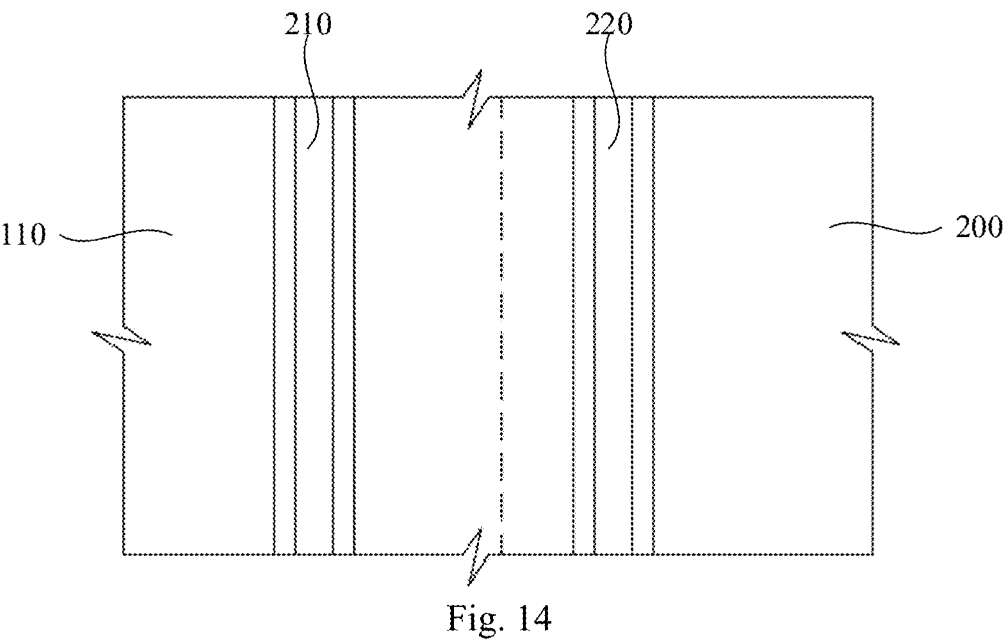
FIG. 14 shows a schematic top view of a semiconductor memory device according to an embodiment of the present invention.

Below, reference is made to FIGS. 1 to 14, in which FIGS. 1 to 13 show schematic cross-sectional views of intermediate structures resulting from process steps in a method for fabricating a semiconductor memory device according to embodiments of the present invention, and FIG. 14 shows a schematic top view of a semiconductor memory device according to an embodiment of the present invention.

Figure 1:
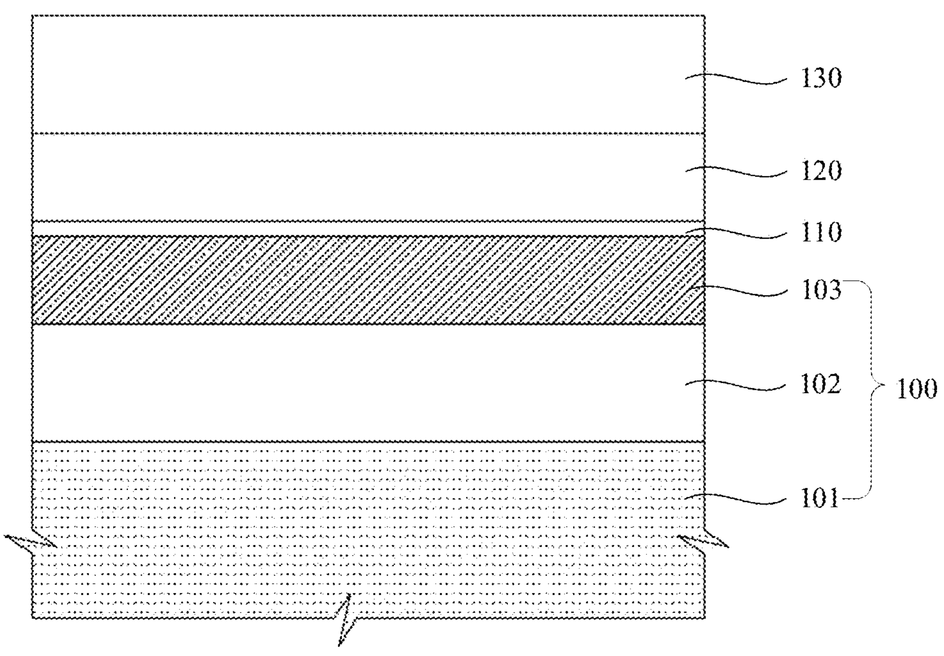
FIGS. 1 to 13 show schematic cross-sectional views of intermediate structures resulting from process steps in a method for fabricating a semiconductor memory device according to embodiments of the present invention.

As shown in FIG. 1, a semiconductor substrate 100 is provided. In embodiments of this application, the semiconductor substrate 100 is a semiconductor-on-insulator (SOI) substrate. In alternative embodiments of this application, the semiconductor substrate 100 may be a bulk silicon substrate or the like. In particular, the semiconductor substrate 100 includes a stack of a doped silicon substrate 101, a buried oxide layer 102 and a silicon layer 103. The doped silicon substrate 101 has a thickness of, for example, 500 nm or greater. The buried oxide layer 102 is preferred to have a thickness of 100 nm to 200 nm. The silicon layer 103 is preferred to have a thickness of 40 nm to 100 nm.

With continued reference to FIG. 1, in embodiments of this application, a pad oxide layer 110 is formed over the semiconductor substrate 100, which covers the silicon layer 103. The pad oxide layer 110 may be formed by thermal oxidation and may have a thickness preferably of 30 Å to 60 Å. A nitride layer 120 is formed over the pad oxide layer 110. The nitride layer 120 may be, for example, a silicon nitride layer having a thickness preferably of 50 nm to 100 nm. The nitride layer 120 is formed over the pad oxide layer 110 possibly by a deposition process. Further, the nitride layer 120 is covered by a hard mask layer 130.

Figure 2:
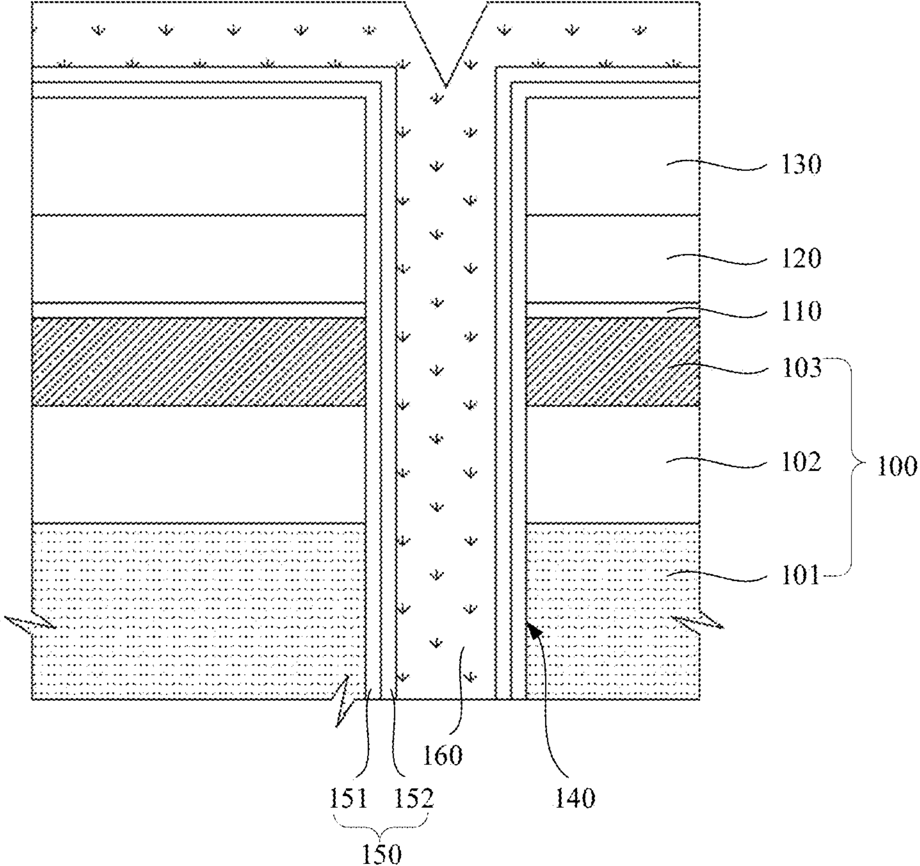

Next, as shown in FIG. 2, a trench 140 is formed in the semiconductor substrate 100. The trench 140 extends from a surface of the hard mask layer 130 through the hard mask layer 130, the nitride layer 120, the pad oxide layer 110, the silicon layer 103 and the buried oxide layer 102 into the doped silicon substrate 101. The trench 140 may either extend through the doped silicon substrate 101, or not.

With continued reference to FIG. 2, in embodiments of this application, the trench 140 is lined with an isolation layer 150. The isolation layer 150 includes a dielectric layer 151 and a barrier layer 152. In particular, in addition to lining the trench 140, the dielectric layer 151 may further extend over a top surface of the hard mask layer 130. In embodiments of this application, the dielectric layer 151 is preferred to be a high-k dielectric material. For example, the dielectric layer 151 may be a hafnium oxide layer having a thickness of, for example, 6 nm to 12 nm. The barrier layer 152 covers the dielectric layer 151. The barrier layer 152 may be, for example, a titanium nitride layer having a thickness of, for example, 6 nm to 12 nm.

In embodiments of this application, a polysilicon layer 160 is then filled in the trench 140. The polysilicon layer 160 fills the trench 140 and extends over the barrier layer 152 surrounding the trench 140.

Figure 3:
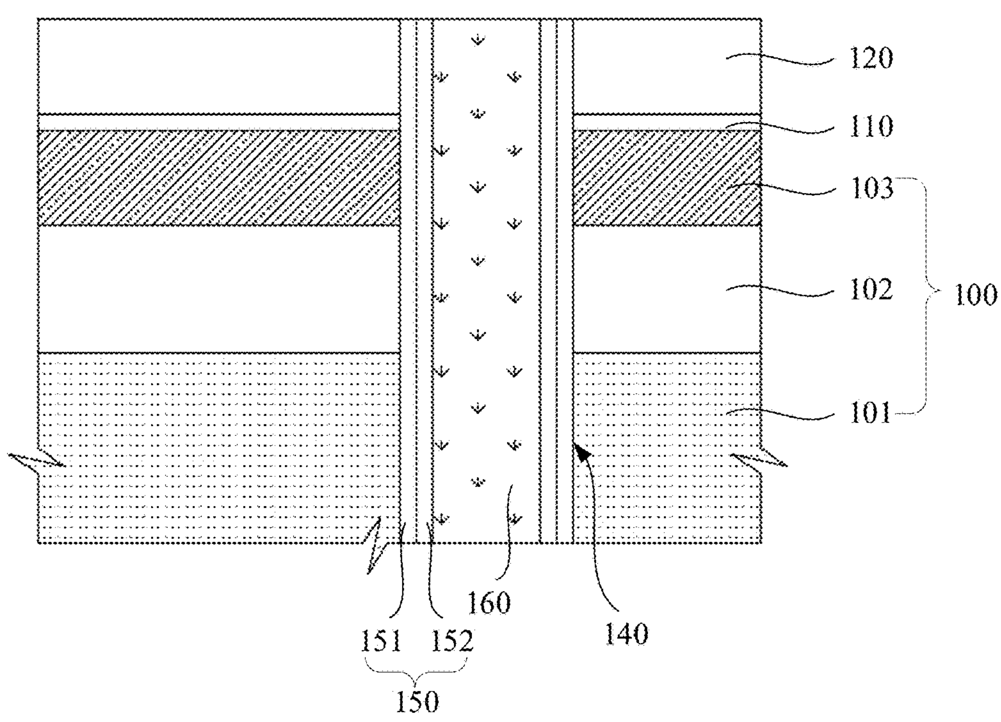

Subsequently, as shown in FIG. 3, the hard mask layer 130 is removed. In embodiments of this application, with a top surface of the nitride layer 120 serving as a stop surface, a chemical mechanical polishing process may be carried out to remove the polysilicon layer 160, the barrier layer 150 and the hard mask layer 130 formed above the nitride layer 120 and a planarized device surface is achieved.

Figure 4:
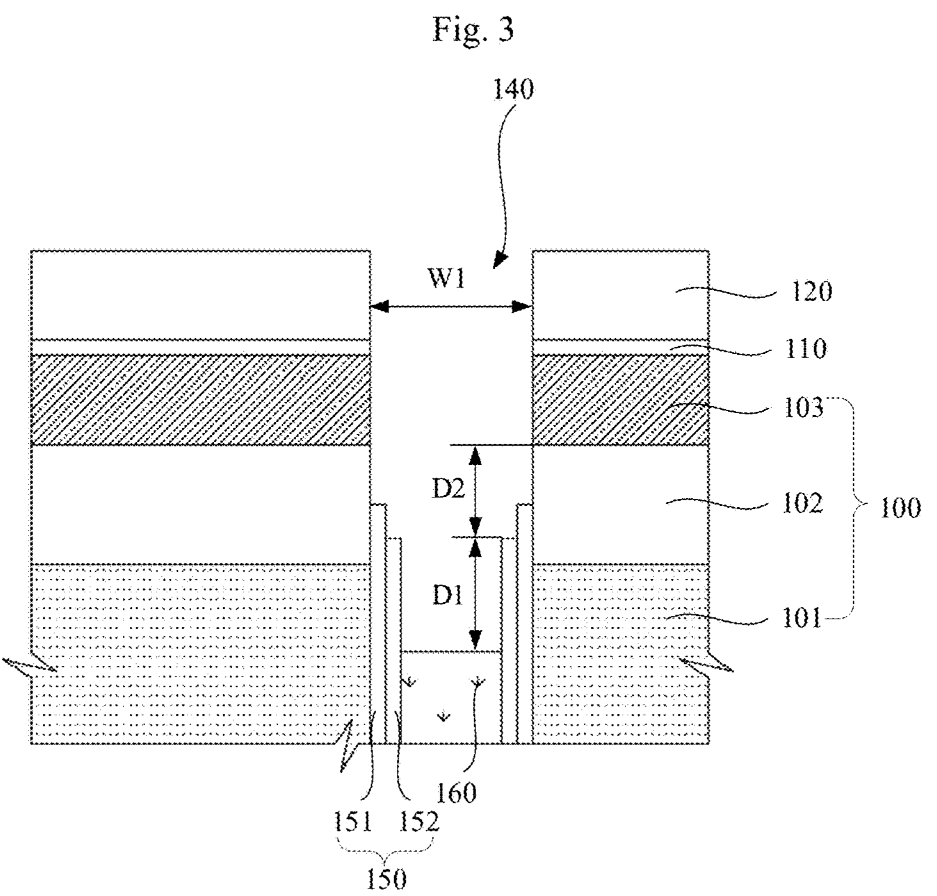

Referring to FIG. 4, an etch-back process is then performed on the dielectric layer 151, the barrier layer 152 and the polysilicon layer 160 to etch a portion of each of them. As a result, the nitride layer 120, the pad oxide layer 110, the silicon layer 103 and a portion of the buried oxide layer 102 are exposed in the trench 140.

As shown in FIG. 4, as a result of the etch-back process, a top surface of the polysilicon layer 160 is lower than each of a top surface of the barrier layer 152 and a top surface of the dielectric layer 151. Moreover, the top surface of the barrier layer 152 is lower than the top surface of the dielectric layer 151. Both the dielectric layer 151 and the barrier layer 152 extend from a surface of the doped silicon substrate 101 to a surface of the buried oxide layer 102. The polysilicon layer 160 is located within the doped silicon substrate 101. That is, the top surface of the polysilicon layer 160 is lower than a top surface of the doped silicon substrate 101. After the etch-back process, the polysilicon layer 160 may be thinned to a thickness between 200 nm and 400 nm.

With continued reference to FIG. 4, in embodiments of this application, denoting a cross-sectional width W1 of the trench 140 as L, a distance D1 from the top surface of the polysilicon layer 160 to the top surface of the barrier layer 152 is greater than or equal to L/4, and a distance D2 from the top surface of the barrier layer 152 to a top surface of the buried oxide layer 102 is smaller than or equal to 2L. This can facilitate the growth and merger of a doped epitaxial silicon layer and an epitaxial polysilicon layer in a subsequent epitaxy process. Preferably, the distance D1 from the top surface of the polysilicon layer 160 to the top surface of the barrier layer 152 is greater than or equal to 3L/2, and the distance D2 from the top surface of the barrier layer 152 to the top surface of the buried oxide layer 102 is smaller than or equal to 3L/4. This can better facilitate the growth and merger of the doped epitaxial silicon layer and the epitaxial polysilicon layer.

Preferably, an etch process is performed on a surface of the silicon layer 103 within the trench 140 to remove impurities therefrom. Here, the impurities are essentially nickel and cobalt silicides. This can enhance the quality of the subsequent epitaxy process.

As shown in FIGS. 5 to 9, an epitaxy process is carried out to form a doped epitaxial silicon layer 170 on the surface of the silicon layer 103 within the trench 140 and to form an epitaxial polysilicon layer 180 on the polysilicon layer 160 within the trench 140. The doped epitaxial silicon layer 170 merges with the epitaxial polysilicon layer 180. In particular embodiments of this application, the doped epitaxial silicon layer 170 is an N-type doped epitaxial silicon layer.

The doped epitaxial silicon layer 170 can serve as a contact between the trench capacitor and a transistor to be formed subsequently. Compared with an embedded contact formed by doping a polysilicon layer, the epitaxially grown doped epitaxial silicon layer 170 has better conductive properties and therefore allows a smaller capacitor, which takes up a reduced chip area, to be used at given required charge and discharge time. Thus, a good tradeoff can be made between charge and discharge time and chip area.

Figure 5:
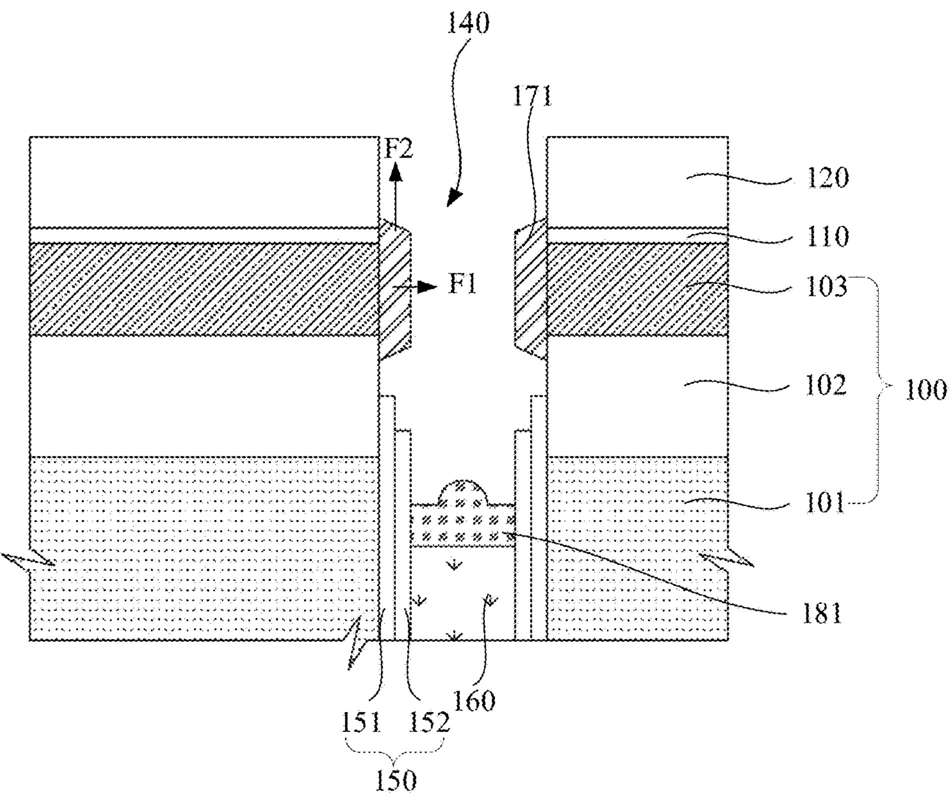
Figure 6:
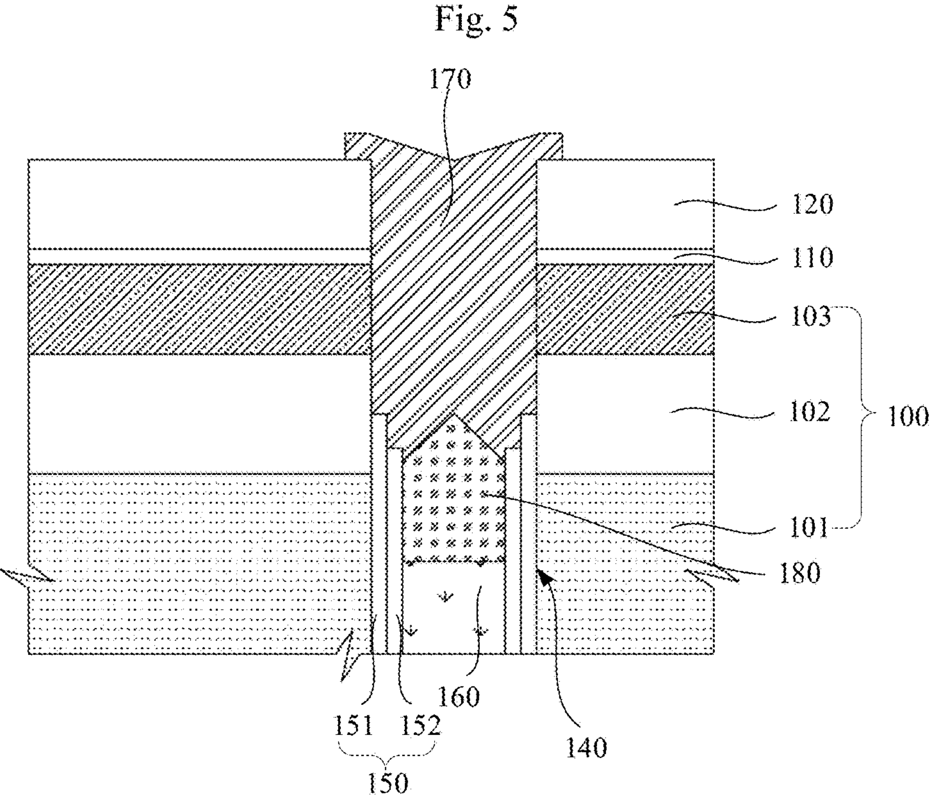

Particular reference is made to FIGS. 5 and 6, which correspond to each other. FIG. 5 shows the ongoing formation of the doped epitaxial silicon layer and the epitaxial polysilicon layer in the process according to an embodiment of the application, and FIG. 6 shows the resulting doped epitaxial silicon layer and epitaxial polysilicon layer. In an embodiment of this application, an N-type epitaxy process is performed in the <110> crystal direction to form the doped epitaxial silicon layer 170. The doped epitaxial silicon layer 170 fills the trench 140 and is <110> oriented in a first direction F1 and <100> oriented in a second direction F2. The first direction F1 corresponds to a widthwise direction of the trench 140, and the second direction F2 corresponds to a depthwise direction of the trench 140.

In the first direction F1, the doped epitaxial silicon layer 170 grows from sidewalls of the trench 140 towards the middle of the trench. In the second direction F2, the doped epitaxial silicon layer 170 extends from the surface of the silicon layer 103 to the surfaces of the buried oxide layer 102, the pad oxide layer 110 and the nitride layer 120. This proceeds until the trench 140 is completely filled. The N-type epitaxy process is performed in the <110> crystal direction until an overgrowth is obtained, the overgrowth thickness is 0.1 to 1.2 times a growth thickness in the <100> crystal direction.

With continued reference to FIGS. 5 and 6, the epitaxial polysilicon layer 180 grows upwardly from the surface of the polysilicon layer 160 and eventually merges with the doped epitaxial silicon layer 170. As shown in FIG. 6, in embodiments of this application, a top surface of the epitaxial polysilicon layer 180 is upwardly conical and at least partially protrudes the top surface of the barrier layer 152. A surface of the doped epitaxial silicon layer 170 protrudes above the surface of the nitride layer 120.

Figure 7:
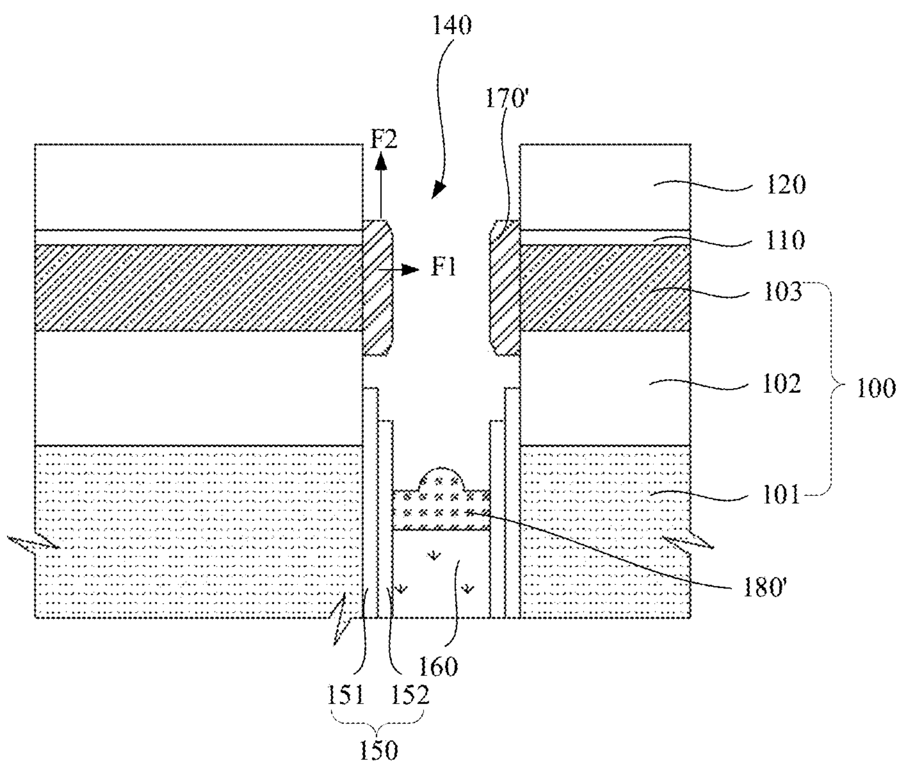
Figure 8:
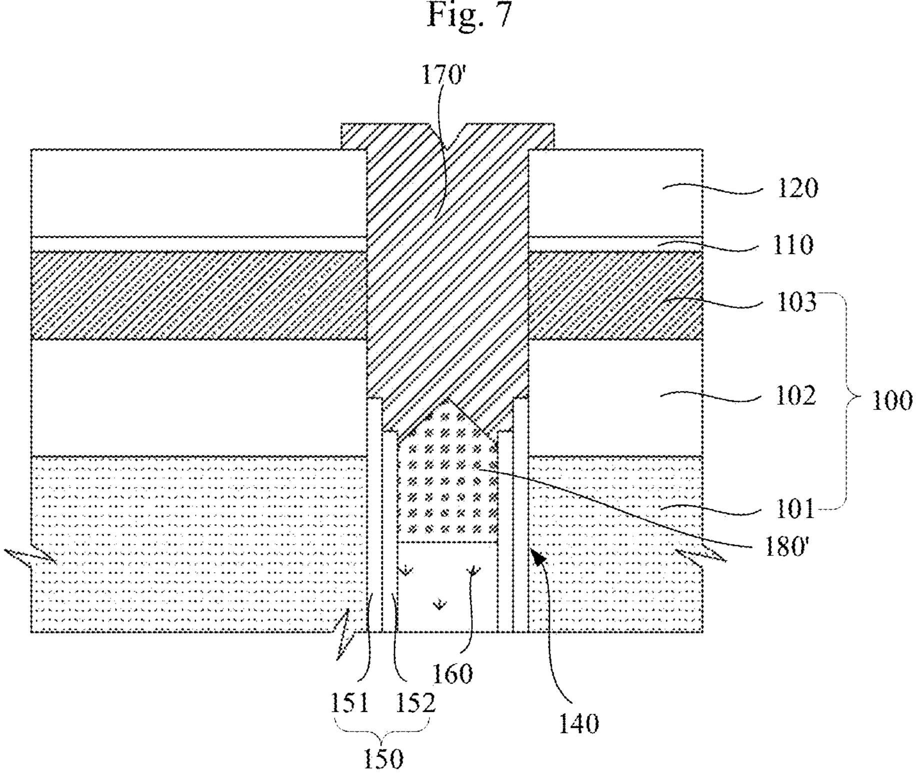

In an alternative embodiment of this application, an N-type epitaxy process is performed in the <100> crystal direction to form the doped epitaxial silicon layer 170' which completely fills the trench 140. Particular reference is made to FIGS. 7 and 8, which correspond to each other. FIG. 7 shows the ongoing formation of the doped epitaxial silicon layer and the epitaxial polysilicon layer in the process, and FIG. 8 shows the resulting doped epitaxial silicon layer and epitaxial polysilicon layer. The N-type epitaxy process is performed in the <100> crystal direction to form the doped epitaxial silicon layer 170' which completely fills the trench 140. The doped epitaxial silicon layer 170' is <100> oriented in both a first direction F1 and a second direction F2. The first direction F1 corresponds to the widthwise direction of the trench 140, and the second direction F2 corresponds to the depthwise direction of the trench 140.

In the first direction F1, the doped epitaxial silicon layer 170' grows from the sidewalls of the trench 140 towards the middle of the trench 140. In the second direction F2, the doped epitaxial silicon layer 170 extends from the surface of the silicon layer 103 to the surfaces of the buried oxide layer 102, the pad oxide layer 110 and the nitride layer 120. This proceeds until the trench 140 is completely filled. The N-type epitaxy process is performed in the <100> crystal direction until an overgrowth is obtained, the overgrowth thickness is the same as a growth thickness.

Accordingly, as shown in FIGS. 7 and 8, the epitaxial polysilicon layer 180' grows upwardly from the surface of the polysilicon layer 160 and eventually merges with the doped epitaxial silicon layer 170'. As shown in FIG. 8, the top surface of the epitaxial polysilicon layer 180' is upwardly conical and at least partially protrudes the top surface of the barrier layer 152. The surface of the doped epitaxial silicon layer 170' protrudes above the surface of the nitride layer 120. Here, the morphology of the epitaxial polysilicon layer of FIG. 8 is substantially the same as the morphology of the epitaxial polysilicon layer 180 of FIG. 6. However, due to growth in different crystal directions, the morphology of the doped epitaxial silicon layer 170' of FIG. 8 differs slightly from the morphology of the doped epitaxial silicon layer 170 of FIG. 6.

Subsequent processes are described below in the context of the doped epitaxial silicon layer 170 and the epitaxial polysilicon layer 180 shown in FIGS. 5 and 6, as an example.

Figures 9, 10:
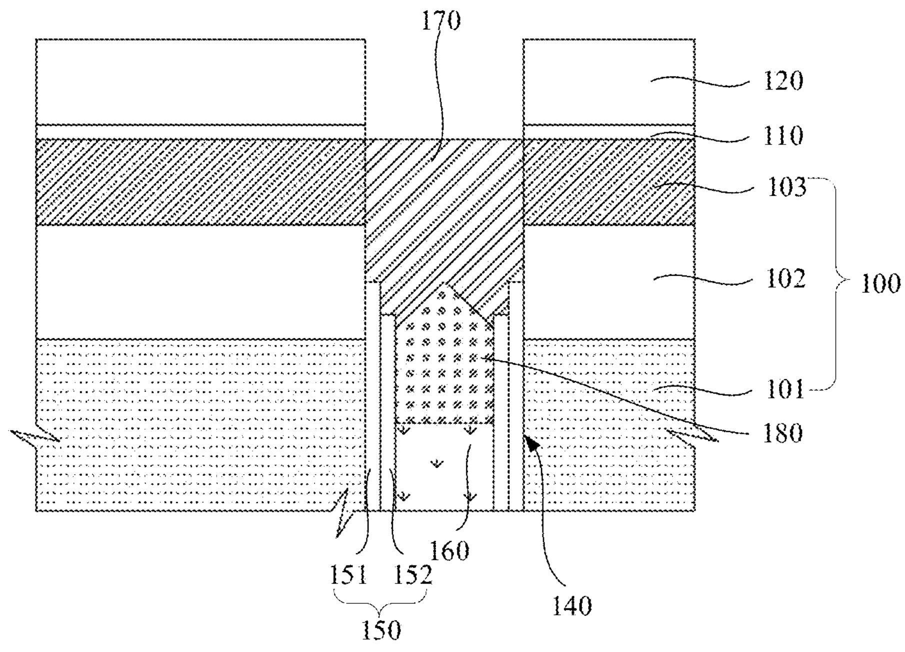

As shown in FIG. 9, an etch-back process is then carried out on the doped epitaxial silicon layer 170, with a bottom surface of the pad oxide layer 110 as an etch stop layer. In this etch process, the quality of the nitride layer 120 may be degraded. Preferably, in order to ensure the quality and reliability of subsequent processes, the nitride layer 120 may be removed, and a new nitride layer 121 may be then deposited. The nitride layer 121 covers both the pad oxide layer 110 and the doped epitaxial silicon layer 170.

As shown in FIG. 10, in embodiments of this application, an isolation trench 190 is formed by etching the nitride layer 121, the pad oxide layer 110, the silicon layer 103 and the doped epitaxial silicon layer 170. The isolation trench 190 extends to the top surface of the buried oxide layer 102 in the depthwise direction, and extends into the doped epitaxial silicon layer 170 in the widthwise direction. A cross-sectional width of a portion of the isolation trench 190 that is located in the doped epitaxial silicon layer 170 is smaller than or equal to half a total cross-sectional width of the doped epitaxial silicon layer 170 which is equal to the cross-sectional width W1 of the trench 140. That is, it is smaller than or equal to L/2.

Figure 11:
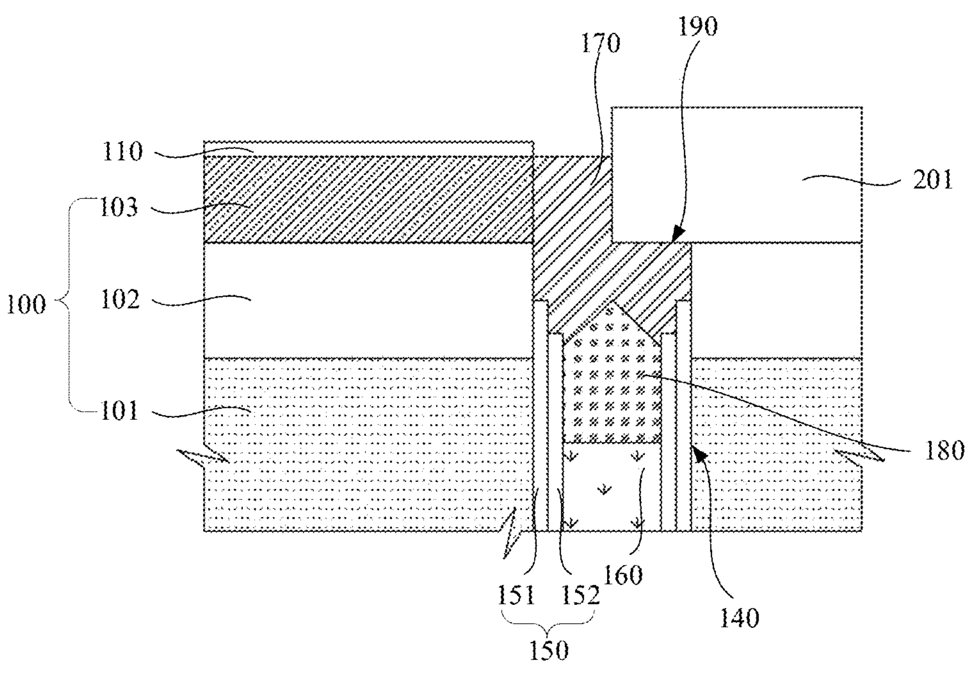
Figure 12:
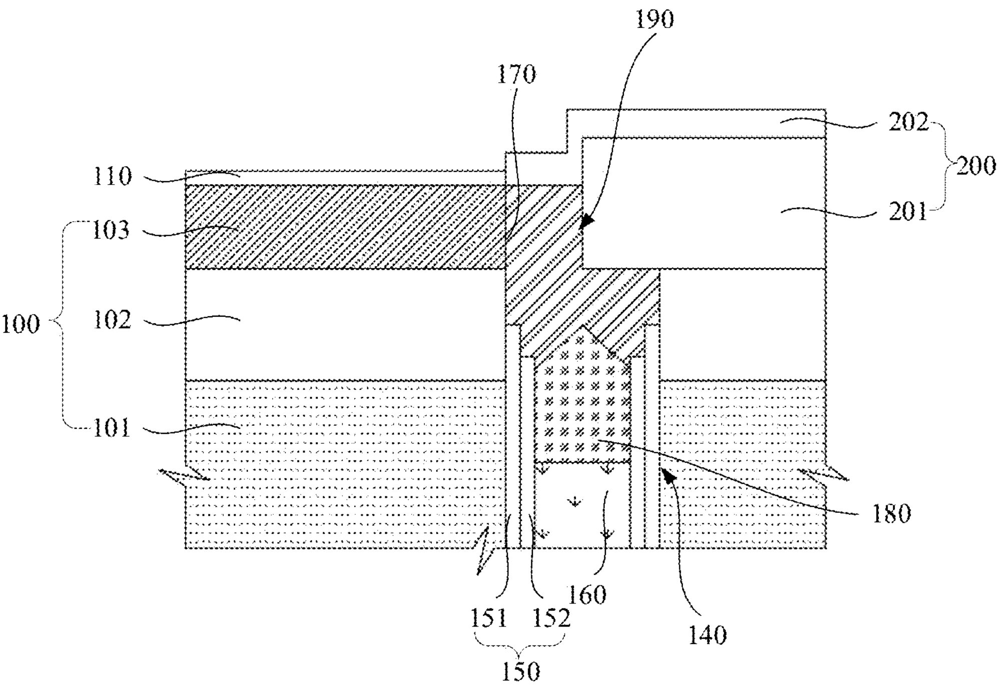

Referring to FIGS. 11 and 12, an isolation dielectric layer 200 is then formed, which fills the isolation trench 190 and covers the doped epitaxial silicon layer 170.

In particular, as shown in FIG. 11, a first isolation dielectric layer 201 may be formed so as to fill the isolation trench 190. Optionally, the first isolation dielectric layer 201 may protrude out of the isolation trench 190. Next, as shown in FIG. 12, a second isolation dielectric layer 202 may be formed so as to cover the first isolation dielectric layer 201 and extend over the doped epitaxial silicon layer 170. The second isolation dielectric layer 202 may either terminate on the surface of the doped epitaxial silicon layer 170, or additionally extend over a portion of the silicon layer 103. The isolation dielectric layer 200 includes the first isolation dielectric layer 201 and the second isolation dielectric layer 202.

After that, referring to FIG. 13, in conjunction with FIG. 14, a gate structure 210 is formed on the silicon layer 103, and a passing word line (PWL) 220 on the isolation dielectric layer 200. Additionally, a source region and a drain region (not labeled) are formed in the silicon layer 103 on opposite sides of the gate structure 210. In particular, the gate structure 210 may be fabricated from a first conductive layer formed on the pad oxide layer 110, and the PWL 220 may be fabricated from a second conductive layer formed on the isolation dielectric layer 200. Further, first spacers (not labeled) may be then formed on opposite sides of the gate structure 210, and second spacers on opposite sides of the PWL 220. The source and drain regions may be formed by doping the silicon layer 103. As such, a transistor and a capacitor are formed, which are electrically connected to each other by the doped epitaxial silicon layer 170. As the doped epitaxial silicon layer 170 has improved conductive properties, the resulting semiconductor memory device provides a good tradeoff between charge and discharge time and chip area. That is, it can provide a desirable retention time while taking up a relatively small chip area.

With continued reference to FIGS. 13 and 14, in embodiments of this application, there is also provided a semiconductor memory device comprising: a semiconductor substrate 100 comprising a stack of a doped silicon substrate 101, a buried oxide layer 102 and a silicon layer 103; a trench 140 formed in the semiconductor substrate 100, the trench 140 lined with an isolation layer 150 extending from a surface of the doped silicon substrate 101 to a surface of the buried oxide layer 102; a polysilicon layer 160 filled in the trench 140, the polysilicon layer 160 having a top surface lower than a top surface of the isolation layer 150; an epitaxial polysilicon layer 180 located on the polysilicon layer 160 in the trench 140; a doped epitaxial silicon layer 170, which is formed on a surface of the silicon layer 103 within the trench 140 and is joined to the epitaxial polysilicon layer 180; an isolation trench 190 extending from the doped epitaxial silicon layer 170 to a surface of the buried oxide layer 102; an isolation dielectric layer 200, which fills the isolation trench 190 and extends over a surface of the doped epitaxial silicon layer 170; a gate structure 210 formed on the silicon layer 103; and a passing word line (PWL) 220 formed on the isolation dielectric layer 200.

The isolation layer 150 includes a dielectric layer 151 that lines the trench 140 and a barrier layer 152 formed on the dielectric layer 151. A top surface of the barrier layer 152 is lower than a top surface of the dielectric layer 151. A top surface of the epitaxial polysilicon layer 180 at least partially protrudes the top surface of the barrier layer 152.

A transistor and a capacitor in the semiconductor memory device is electrically connected to each other by the doped epitaxial silicon layer 170. Since the doped epitaxial silicon layer 170 has better conductive properties, the semiconductor memory device can provide a good tradeoff between charge and discharge time and chip area.

The description presented above is merely that of some preferred embodiments of the present invention and is not intended to limit the scope thereof in any sense. Any and all changes and modifications made by those of ordinary skill in the art based on the above teachings fall within the scope of the invention.

The invention claimed is:

1. A method for fabricating a semiconductor memory device, comprising:

providing a semiconductor substrate that comprises a stack of a doped silicon substrate, a buried oxide layer and a silicon layer, forming at least one trench in the semiconductor substrate, wherein the at least one trench is lined with an isolation layer, wherein the isolation layer extends from a surface of the doped silicon substrate to a surface of the buried oxide layer, wherein the at least one trench is filled with a polysilicon layer, and wherein a top surface of the polysilicon layer is lower than a top surface of the isolation layer;

forming a doped epitaxial silicon layer on a surface of the silicon layer within the at least one trench and forming an epitaxial polysilicon layer on the polysilicon layer within at least one the trench by performing an epitaxy process, wherein the epitaxial polysilicon layer is joined to the doped epitaxial silicon layer;

forming at least one isolation trench by etching the silicon layer and the doped epitaxial silicon layer;

forming an isolation dielectric layer, wherein the isolation dielectric layer fills the at least one isolation trench and extends over the doped epitaxial silicon layer; and forming at least one gate structure on the silicon layer and forming a passing word line (PWL) on the isolation dielectric layer.

2. The method of claim 1, wherein forming a pad oxide layer and a nitride layer that are stacked over the semiconductor substrate, wherein the at least one trench extends through the pad oxide layer and the nitride layer, wherein the isolation layer comprises a dielectric layer that lines the at least one trench and a barrier layer formed on the dielectric layer, wherein: a top surface of the barrier layer is lower than a top surface of the dielectric layer, and wherein a cross-sectional width of the trench is L; a distance from the top surface of the polysilicon layer to the top surface of the barrier layer is equal to or greater than L/4; and a distance from the top surface of the barrier layer to a top surface of the buried oxide layer is smaller than or equal to 2L.

3. The method of claim 2, wherein forming the doped epitaxial silicon layer on the surface of the silicon layer within the at least one trench by performing the epitaxy process comprises:

performing an N-type epitaxy process in <100> or <110> crystal direction to form the doped epitaxial silicon layer that fills the at least one trench, wherein the doped epitaxial silicon layer grows in the <100> or <110> crystal direction.

4. The method of claim 3, wherein the N-type epitaxy process is performed in the <110> crystal direction until an overgrowth thickness is 0.1 to 1.2 times a growth thickness.

5. The method of claim 3, wherein the N-type epitaxy process is performed in the <100> crystal direction until an overgrowth thickness is equal to a growth thickness.

6. The method of claim 2, wherein forming the doped epitaxial silicon layer on the surface of the silicon layer within the at least one trench and forming the epitaxial polysilicon layer on the polysilicon layer within the at least one trench by performing the epitaxy process comprises: forming the doped epitaxial silicon layer until a top surface thereof protrudes a top surface of the nitride layer, and wherein the method further comprises, before forming the at least one isolation trench by etching the silicon layer and the doped epitaxial silicon layer, etching back the doped epitaxial silicon layer, with a bottom surface of the pad oxide layer serving as an etch stop surface.

7. The method of claim 2, wherein at least a portion of a top surface of the epitaxial polysilicon layer protrudes the top surface of the barrier layer.

8. The method of claim 2, wherein forming the isolation dielectric layer, which fills the at least one isolation trench and extends over the doped epitaxial silicon layer, comprises:

forming a first isolation dielectric layer, wherein the first isolation dielectric layer fills the at least one isolation trench; and forming a second isolation dielectric layer, wherein the second isolation dielectric layer covers the first isolation dielectric layer and extends over the doped epitaxial silicon layer, and wherein the isolation dielectric layer comprises the first isolation dielectric layer and the second isolation dielectric layer.

9. A semiconductor memory device, comprising:

a semiconductor substrate comprising a stack of a doped silicon substrate, a buried oxide layer and a silicon layer, wherein at least one trench is formed in the semiconductor substrate, wherein the at least one trench is lined with an isolation layer, wherein the isolation layer extends from a surface of the doped silicon substrate to a surface of the buried oxide layer, and wherein the at least one trench is filled with a polysilicon layer that has a top surface lower than a top surface of the isolation layer;

an epitaxial polysilicon layer formed on the polysilicon layer within the at least one trench;

a doped epitaxial silicon layer formed on a surface of the silicon layer within the at least one trench, wherein the doped epitaxial silicon layer is joined to the epitaxial polysilicon layer;

at least one isolation trench extending from inside the doped epitaxial silicon layer to the surface of the buried oxide layer;

an isolation dielectric layer, which fills the at least one isolation trench and extends over the doped epitaxial silicon layer; and at least one gate structure formed on the silicon layer and a passing word line (PWL) formed on the isolation dielectric layer.

10. The semiconductor memory device of claim 9, wherein the isolation layer comprises a dielectric layer that lines the at least one trench and a barrier layer formed on the dielectric layer, wherein the barrier layer has a top surface lower than a top surface of the dielectric layer, and wherein at least a portion of a top surface of the epitaxial polysilicon layer protrudes the top surface of the barrier layer.

* * * * *